US008020599B2

(12) United States Patent
Baan et al.

(10) Patent No.: US 8,020,599 B2
(45) Date of Patent: *Sep. 20, 2011

(54) COMMON CARRIER

(75) Inventors: Robert L Baan, Wallkill, NY (US); Harry D Cox, Rifton, NY (US); John P Gauci, Poughkeepsie, NY (US); John R Lankard, Jr., Poughkeepsie, NY (US); David C Long, Wappingers Falls, NY (US); Thong N Nguyen, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 660 days.

This patent is subject to a terminal disclaimer.

(21) Appl. No.: 11/753,874

(22) Filed: May 25, 2007

(65) Prior Publication Data
US 2007/0226972 A1    Oct. 4, 2007

Related U.S. Application Data

(63) Continuation of application No. 10/875,699, filed on Jun. 24, 2004, now Pat. No. 7,278,459.

(51) Int. Cl.
*B32B 37/00* (2006.01)

(52) U.S. Cl. ........................................ 156/443; 156/494

(58) Field of Classification Search .................. 156/160, 156/443, 494; 160/378; 101/127.1; 38/102.91
See application file for complete search history.

(56) References Cited

U.S. PATENT DOCUMENTS

| 3,391,635 | A |   | 7/1968 | Matheus |
|---|---|---|---|---|
| 3,414,994 | A |   | 12/1968 | Jaccard et al. |
| 4,381,706 | A |   | 5/1983 | Harpold |
| 6,742,565 | B2 |   | 6/2004 | Badley |
| 7,278,459 | B2 | * | 10/2007 | Baan et al. ................ 156/494 |

FOREIGN PATENT DOCUMENTS

| EP | 0073319 A2 | 3/1983 |
|---|---|---|
| JP | 2-108032 A | 4/1990 |

* cited by examiner

*Primary Examiner* — Jeff H Aftergut
(74) *Attorney, Agent, or Firm* — DeLio & Peterson LLC; Peter W. Peterson

(57) ABSTRACT

A method for mounting a film, used to fabricate a mask for use in screening an electronic device, to a common carrier frame. The common carrier frame has an outer edge along an outer periphery and an opening in a central portion of the frame. The method includes applying external pressure to the frame outer edge to compress the frame inward and reduce the opening, securing a film to the frame, the film covering the frame opening, and releasing the pressure on the frame to expand the opening and place the film in tension.

14 Claims, 7 Drawing Sheets

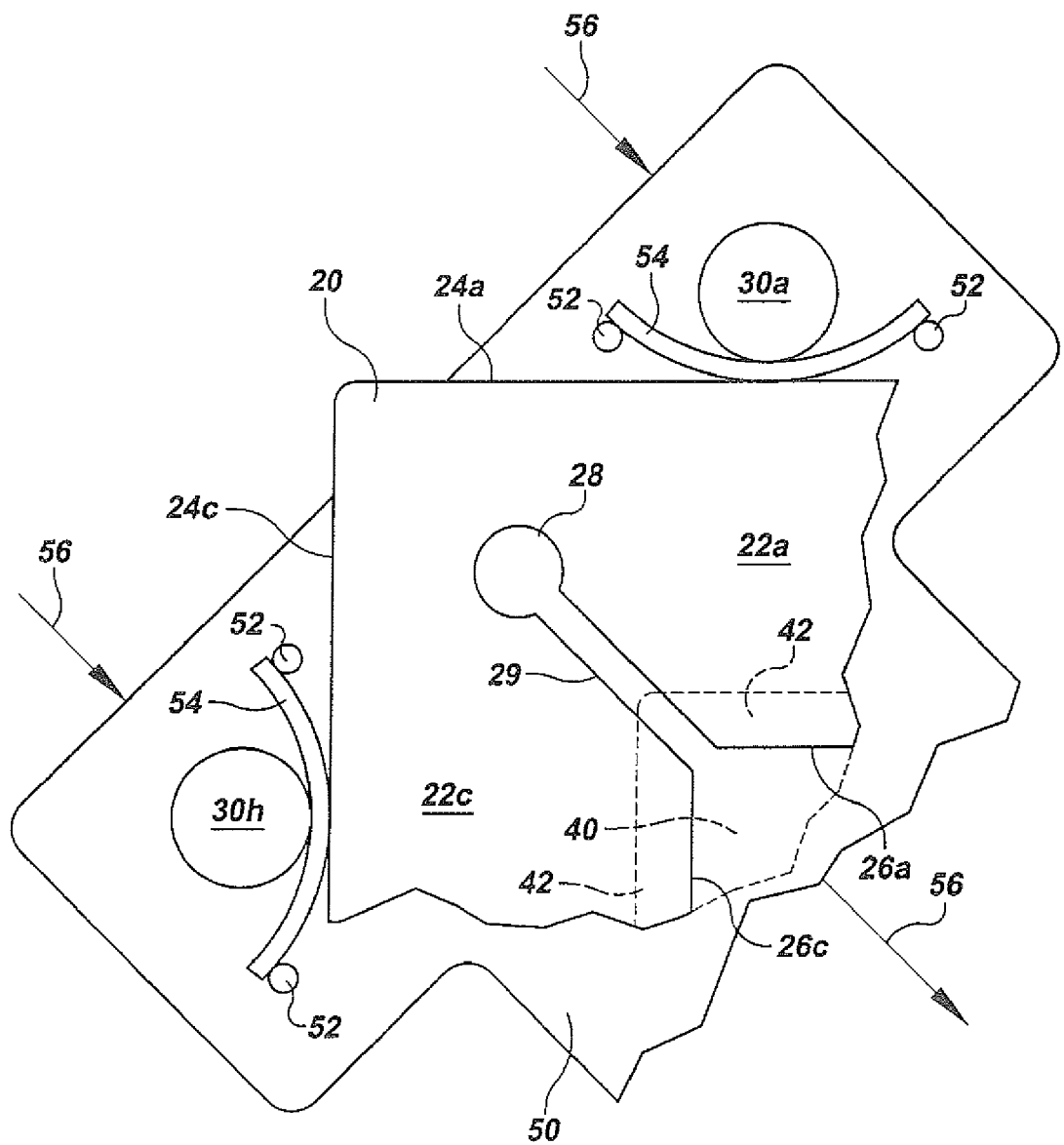

COMMON CARRIER

RELATED APPLICATIONS

This application is a continuation of application Ser. No. 10/875,699 filed Jun. 24, 2004, now U.S. Pat. No. 7,278,459.

BACKGROUND OF THE INVENTION

1. Field of the Invention

The present invention generally relates to the fabrication of masks used in the manufacture of electronic devices and, more particularly, to a method and system for making metal foil masks used to screen wiring patterns onto the substrate material of multilayer ceramic chip carriers.

2. Description of Related Art

Multi-layer ceramic substrates (MLC) are employed for making semiconductor devices. The fabrication of multi-layer ceramic chip carriers requires the ability to accurately transfer conductive pastes onto a substrate material. The most common method for the transfer of paste is a screening process, and a mask is used to precisely screen wiring patterns onto the substrate material. The openings of a high aspect ratio mask are fabricated with exacting dimensions to control the volume of material that is transferred to the substrate. A preferred mask construction is generated from thin metal films, such as Cu, Ni or Mo-based foils.

Ceramic wiring density has continually increased over time and design grids reduced to meet the ever-evolving technology of the silicon chip. The increasing amount of wiring on substrate layer places demands on the mask manufacturer. In order to achieve proper control of paste flow and volume, the mask must be very planar to the substrate surface to successfully gasket the conductive material. Any mechanical flaw of the mask surface can result in some amount of unwanted paste deposition. The percent open area on many of today's designs result in a mask that is rather fragile and highly subject to mechanical damage.

The process of building electroplated, thick-film, high aspect ratio metal masks involves several wet process steps, and has traditionally been a manually intensive operation. Operators had to transfer thin planar mask units between various process transport fixtures, with each fixture being specialized for a particular process machine. The continual transfer resulted in significant yield losses due to mechanical damage. Also, the demanding resist feature sizes required to generate the mask are easily de-bonded by any excess flex of the metal material.

While vacuum-flattening copper foil masks before securing them with adhesive to rigid frames has been attempted, this has not solved the problem of achieving a high degree of flatness in the foil.

SUMMARY OF THE INVENTION

Bearing in mind the problems and deficiencies of the prior art, it is therefore an object of the present invention to provide an improved method and system for mounting a film, used to mask an electronic device during fabrication, to a common carrier frame.

It is another object of the present invention to provide a method and system that increases the flatness of the film used to mask an electronic device during fabrication.

A further object of the invention is to provide a method and system that protects the mask film and maintain flatness thereof during fabrication of the mask.

It is yet another object of the present invention to provide a system that protects the mask film and maintain flatness thereof through processes of various temperatures from about 20° to 85° C.

Still other objects and advantages of the invention will in part be obvious and will in part be apparent from the specification.

The above and other objects, which will be apparent to those skilled in art, are achieved in the present invention which is directed to a method for mounting a film, used to fabricate a mask for use in screening an electronic device, to a common carrier frame. The common carrier frame has an outer edge along an outer periphery and an opening in a central portion of the frame. The method includes applying external pressure to the frame to compress the frame inward and reduce the opening, securing a film to the frame, the film covering the frame opening, and releasing the pressure on the frame to expand the opening and place the film in tension.

Preferably, external pressure is applied to the frame outer edge. The frame may have a plurality of sides along its outer periphery, and the external pressure is applied to positions on at least two sides of the frame, preferably to at least two discrete positions on each side. More preferably, the frame has four sides, with the outer edge being along the sides, and the external pressure is applied to all four sides of the frame outer edge, for example, at an acute angle to at least one of the sides.

The external pressure is applied to the frame outer edge to reduce distance across the opening by displacing the frame a desired distance or by applying a desired force to the frame. The method preferably includes measuring pressure or distance to determine degree of compression of the frame.

The frame may be mounted on a base, and the method may further include simultaneously urging the frame toward the base as pressure is applied to the frame. The method may also include flattening the film while it is secured to the frame to cover the frame opening.

In another aspect, the present invention is directed to an apparatus for mounting a film, used to fabricate a mask for use in screening an electronic device, to a common carrier frame. The frame has an outer edge along an outer periphery and an opening in a central portion of the frame. The apparatus includes a base for holding the frame and a pressure applicator adapted to apply external pressure to the frame, while the frame is held in the base. The external pressure compresses the frame inward and reduces the opening while the film is secured to the frame to cover the frame opening. The pressure applicator is releasable once the film is secured to the frame. Preferably, the pressure applicator is adapted to apply external pressure to the frame outer edge.

The apparatus may further include means for flattening the film while it is secured to the frame to cover the frame opening, such as a vacuum chuck.

The pressure applicator preferably applies pressure to a plurality of discrete positions along the frame outer edge. Where the frame has a plurality of sides along its outer periphery, e.g., four sides, the pressure applicator preferably applies pressure to at least two discrete positions on each side, and more preferably to all four sides of the frame outer edge.

The pressure applicator may include pins for applying pressure directly or indirectly to the frame outer edge. The pressure applicator may optionally include an interposer between the pin and the frame outer edge, so that the pin is adapted to apply pressure to the interposer which in turn is adapted to apply pressure to the frame outer edge. The pressure applicator may further include includes a tapered portion to contact the frame edge and urge the frame toward the base as pressure is applied to the frame.

The common carrier frame may have a plurality of segments along an outer periphery, an opening in a central portion of the frame, and, optionally, a notch in at least one frame segment extending from the opening in the frame central portion.

The pressure applicator may displace the frame a desired distance, e.g., with a cam. or may apply a desired force to the frame, e.g., with at least one pressure cylinder, and the apparatus preferably includes a pressure or distance measuring device to determine degree of compression of the frame.

The film typically comprises copper-based foil, and an adhesive is used to secure the film to the frame.

BRIEF DESCRIPTION OF THE DRAWINGS

The features of the invention believed to be novel and the elements characteristic of the invention are set forth with particularity in the appended claims. The figures are for illustration purposes only and are not drawn to scale. The invention itself, however, both as to organization and method of operation, may best be understood by reference to the detailed description which follows taken in conjunction with the accompanying drawings in which:

FIG. 6 is a close-up view of a corner portion of the common carrier frame of FIG. 1, showing one preferred embodiment of the pressure applicator.

DESCRIPTION OF THE PREFERRED EMBODIMENT(S)

In describing the preferred embodiment of the present invention, reference will be made herein to FIGS. 1-12 of the drawings in which like numerals refer to like features of the invention.

The present invention provides an apparatus and method for providing a common carrier frame on which a foil or other film for screening a multi-layer substrate is secured, along with an apparatus and method to generate a controlled compression of the carrier prior to securing the masking film. The invention employs a strong, reusable transport carrier system that is unaffected by the various process chemistries used in mask production. The thin planar films used for the masks are preferably affixed to the carrier system using an adhesive. During affixation to the carrier, it is important to impart some amount of tension to the film to promote planarity with the starting raw substrate. The necessary tension is achieved by pre-compressing the outer edges of the common carrier frame before attaching the mask film. Once the mask is mounted onto the carrier and the external pressure is removed, the mask film has a high degree of flatness and the potential for accidental mechanical damage to the mask film is practically eliminated. The pre-stressed frame thereafter continues to supply tension to the mask film during subsequent processing to produce the screening mask.

Figure 1:
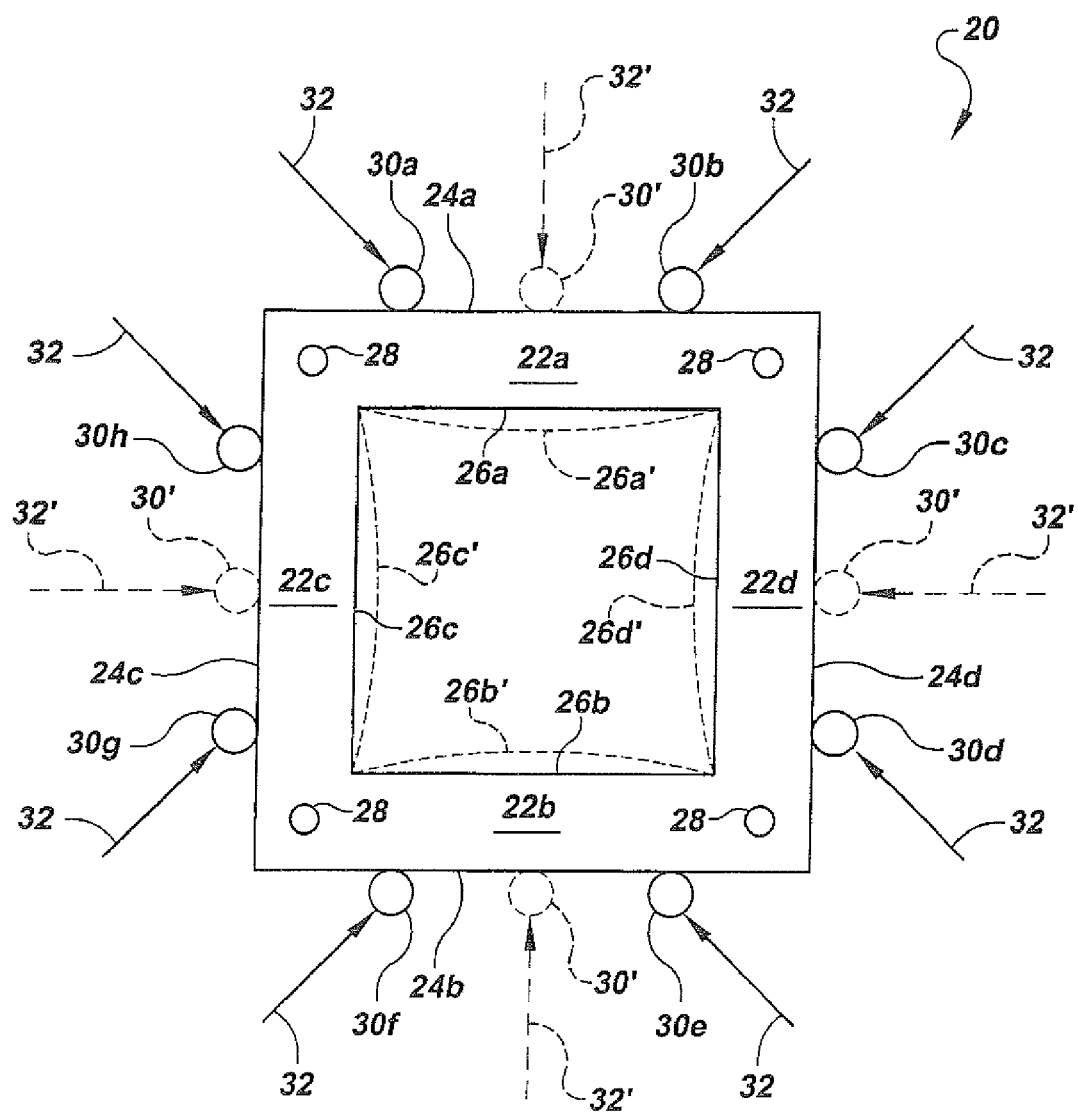
FIG. 1 is a top plan view of the preferred mask carrier frame of the present invention, showing portions of the fixture employed to compress the outer edges of the frame.

Referring to FIG. 1, the preferred common carrier frame 20 is shown as preferably a substantially planar, four-sided (rectangular) frame composed of frame segments 22a, 22b, 22c, and 22d. These frame segments have substantially straight outer edges 24a, 24b, 24c, and 24d, and substantially straight inner edges 26a, 26b, 26c, and 26d. The inner edges define the inner periphery of the opening in which the foil or other thin flexible film mask for the MLC or other electronic device is to be secured. While the inner edges are preferably straight as shown by the solid lines, they may be curved inward as shown by phantom lines 26a', 26b', 26c', and 26d' to provide greater cross-section at the mid-point of each of the frame segments 22a, 22b, 22c, and 22d, respectively to control the amount of deflection of the center portion of the segment. Locator holes 28 within the corners of the frame permit the frame and mask film to be accurately positioned during subsequent processing. The frame is preferably made of fiberglass, although other materials may be utilized. The frame material should have chemical compatibility with the process chemicals to be used in manufacturing the metal screening mask, and be strong and stable. It should also have of thermal expansion (CTE) which matches the mask film to be mounted therein, and be an electrical insulator so that it does not plate-up during electroplating. Preferred frame materials are FR-4 or G-10 type fiberglass. The frame thickness may be any that meets the requirements of the system in which it is employed, and is typically in the range of about 0.032 in (0.8 mm) to 0.250 in (6.4 mm), for example, about 0.093 in (2.4 mm). Typically, the frame opening is sized to receive a 12 in. by 12 in (30 cm×30 cm) mask film, and the frame dimensions are sized appropriately larger to provide mechanical support and sufficient surface for the mask film to be attached.

Figure 2:
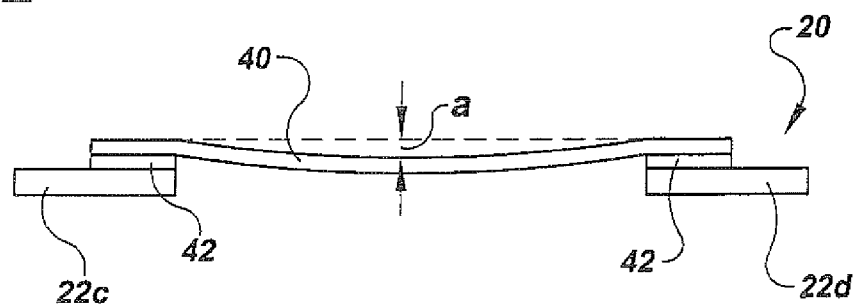
FIG. 2 is a side elevational view, in cross section, showing the base copper foil adhesively mounted to a common carrier frame that has not been pre-compressed.

FIG. 2 depicts a copper foil or other metallic film 40, which is typically 0.001 in. (0.025 mm) thick and laminated with a layer of dry film resist on one or both surfaces (not shown). Mask film 40 is secured to a portion of the surface of frame 20 by an adhesive layer 42, which is preferably a commercially available double-sided 3M Corp. adhesive tape (502FL). The adhesive creeps proportionally more at higher shear stress levels, which results in uniform tension in the mask film. The adhesive should be compatible with plating chemicals utilized in processing the mask as well as the temperature range employed. Additionally the adhesive should be a low outgassing material that can be removed without damage to the frame, since the frame is intended to be reusable.

Figure 3:
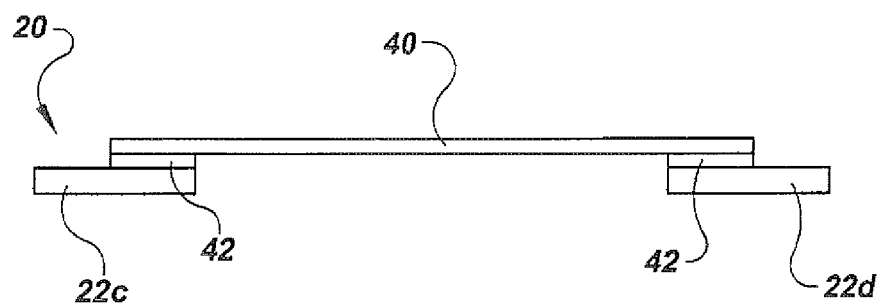
FIG. 3 is a side elevational view, in cross section, of a copper foil mounted to a common carrier frame that has undergone pre-compression, bonding and compression release in accordance with the present invention.

As shown in FIG. 2, foil 40 is sagging by a dimension "a" from an ideally flat position. Such sagging results in slack, wrinkles or other non-flat areas that are detrimental to the processing of the mask and, subsequently, the MLC. In accordance with the present invention, such slack or wrinkles may be substantially reduced or eliminated to achieve a flat or near-flat mask film surface, as shown in FIG. 3, by precompressing the outer edges of the frame inward prior to adhering the foil or film thereto.

Referring to back to FIG. 1, such frame compression pressure may be applied by any means, such as by pressure applicator pins 30' shown in phantom centered on each of the four sides of the frame, and adapted to apply pressure inward as shown by phantom force 32'. Instead of pins, any other mechanical configuration of the pressure applicator may be used, preferably so that pressure is applied in discrete locations on the frame outer edge. Preferably, the compression force is supplied by spaced pairs of pressure applicators on each side of the frame. As shown in FIG. 1, pins 30a and 30b apply force to edge 24a, pins 30c and 30d apply force to edge 24d, pins 30e and 30f apply force to edge 24b and pins 30g and 30h apply force to edge 24c. More preferably, the force direction is at an angle of approximately 45° to the sides of frame 20, so that pin pairs 30h, 30a; pin pairs 30b, 30e; pin pairs 30d, 30e; and pin pairs 30f and 30g apply the force in the common direction shown by force arrows 32 toward the center of the frame. The pins are located at positions corresponding to points approximately 20% and 80% of the length of each of the sides. Each pin is preferably within the inner edges of the frame segment perpendicular to the segment against which the pin is applying pressure so that, for example, pins 30a and 30b are within the line formed by inner edges 26c and 26d.

Figure 4:
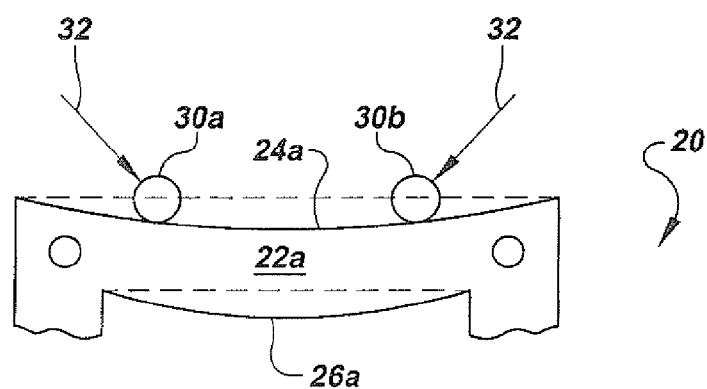
FIG. 4 is a top plan view of a portion of the common carrier frame of FIG. 1, showing compression of the edges along one side of the frame.
Figure 5:
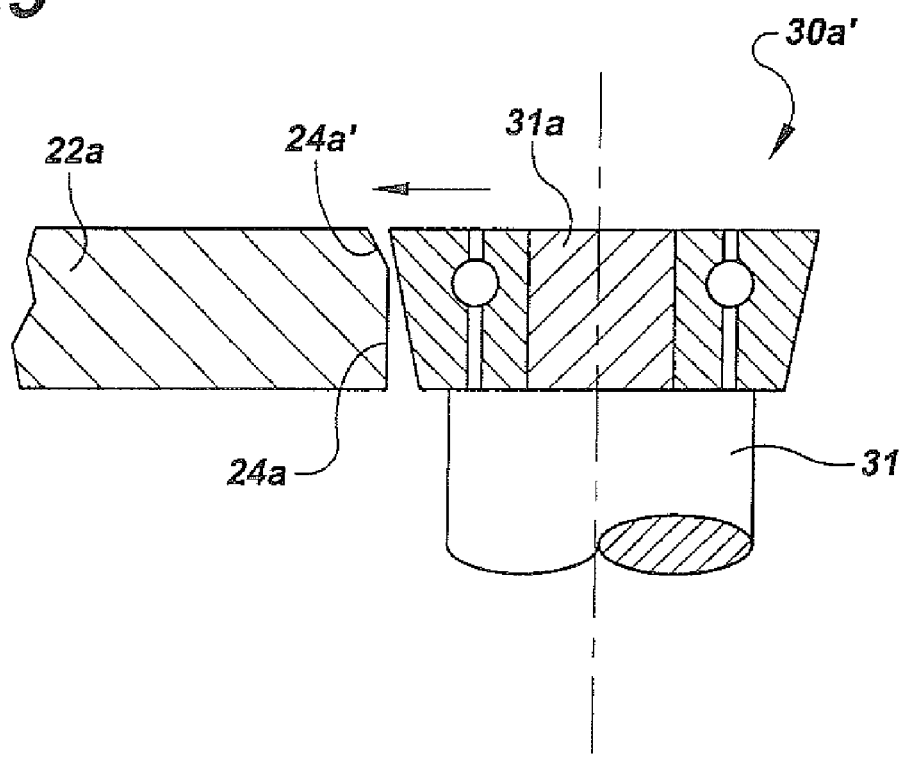
FIG. 5 is a side cross-sectional view of one embodiment of a pressure applicator pin that may be used to apply compression to the frame shown in FIGS. 1-4.

The compression of a frame edge prior to adhering the mask film is depicted in FIG. 4. Pins 30a and 30b have force applied in the directions shown by arrows 32, which causes bending of the frame segment 22a as shown, compared to the un-compressed phantom lines. The amount of compression of each frame outer edge is typically up to approximately 0.025 in. (0.6 mm) and should be adjustable by controlling air pressure to air cylinders supplying compressive force, or by some other means for applying force or displacement.

The contact points 30 preferably are hardened steel or tungsten carbide pins having a diameter in the range of about 0.100 in (2.5 mm) to 1.00 in (25.4 mm), preferably about 0.250 in (6.4 mm). In a preferred embodiment, the contact points incorporate a hardened taper roller bearing such as that shown in FIG. 5, where roller bearing 30a' is mounted on pin 31a extending upward from shaft 31 and applies force in the direction shown by the arrow against the frame outer edge 24a of frame segment 22a. The frame segment edge has a chamfered corner 24a' which cooperates with the tapered edge of roller bearing 30a' to maintain downward force to urge the fiberglass frame against the base 64 on which it rests (discussed in connection with FIG. 11).

Figure 7:
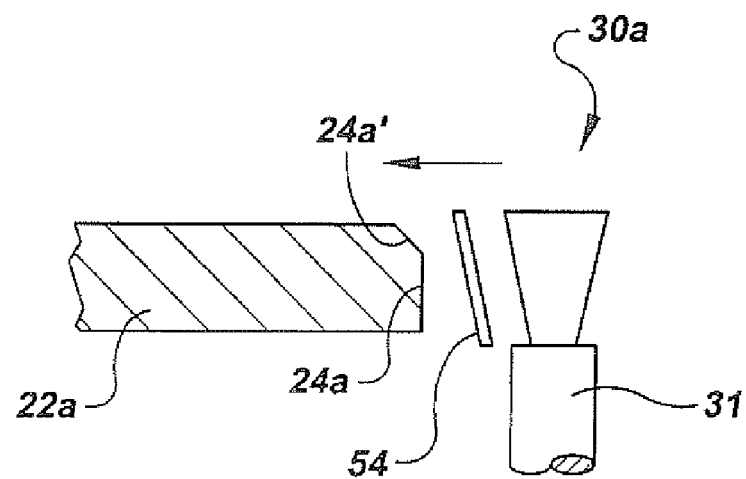
FIG. 7 is a side cross-sectional view of the pin and spring that may be used to apply compression in the pressure applicator shown in FIG. 6.

A preferred fixture for applying pressure to the frame edges is depicted in FIG. 6. As shown, pins 30a and 30h are mounted on a common compression plate 50 which is either pushed or pulled in direction 56, toward the center of the frame. To further prevent damage and wear to the frame edges, hardened flat spring interposers 54 are positioned between the pins and the frame. These springs 54 are held in position between pressure applicator pins 30h and 30a, and spring locator pins 52. Pin 30a is also shown in FIG. 7 having a tapered edge that applies pressure in the direction shown by the arrow against spring 54 and frame edge 24a. These flat springs reduce abrasion to and wear on the frames caused by pins 30 sliding directly on the frame 20 edges. In an alternate embodiment of the frame, channels or notches 29 are cut between the frame interior opening and locator holes 28 at the frame corners, to permit additional flexing or compression of the frame segments. Such notches reduce the rigidity of the frame, however, allowing more twisting in the plane of the foil 40.

Figure 8:
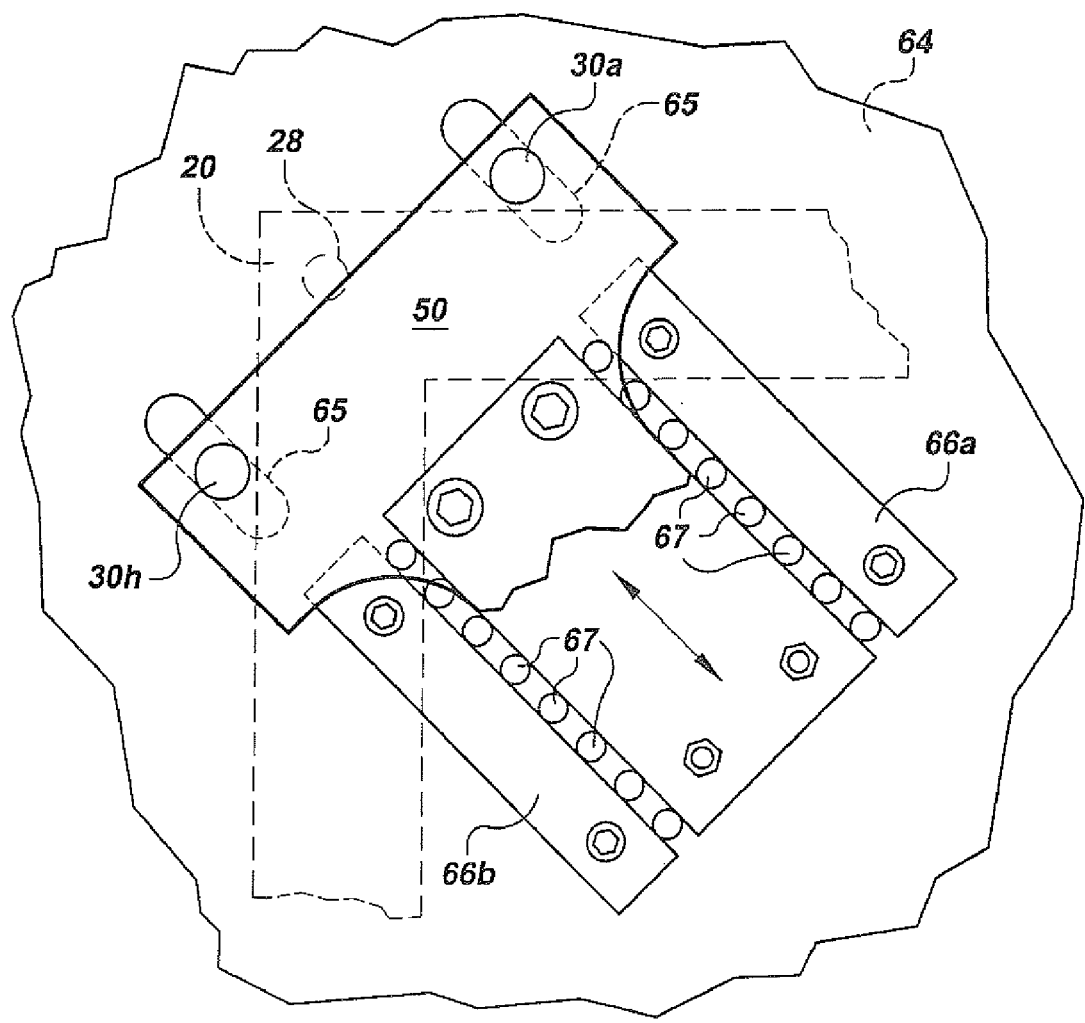
FIG. 8 is a close-up view of a corner portion of the common carrier frame of FIG. 1, showing an embodiment of the pressure applicator of FIG. 6.

FIG. 8 depicts an embodiment of the pressure-applying fixture of FIG. 6, which is mounted under frame mounting base 64 (discussed further in connection with FIG. 11, below). Pins 30a, 30h are disposed on compression plate 50 which is slidingly mounted between fixed supports 66a, 66b and rolls on ball bearings 67 toward and away from the center of the frame.

Figure 9:
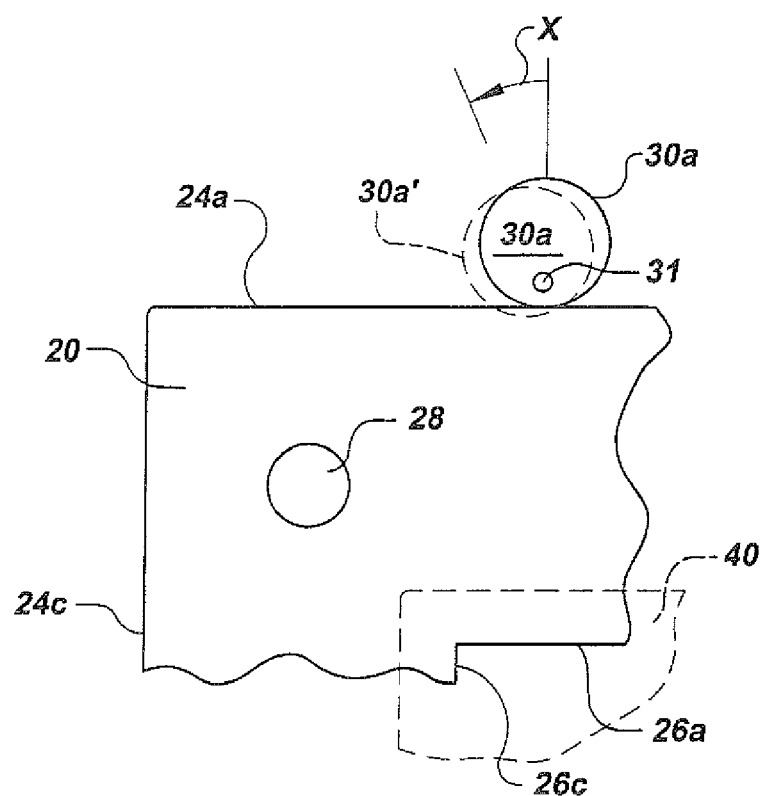
FIG. 9 is a close-up view of a corner of the common carrier frame of FIG. 1, showing an alternate cam-action embodiment of the pressure applicator.
Figure 10:
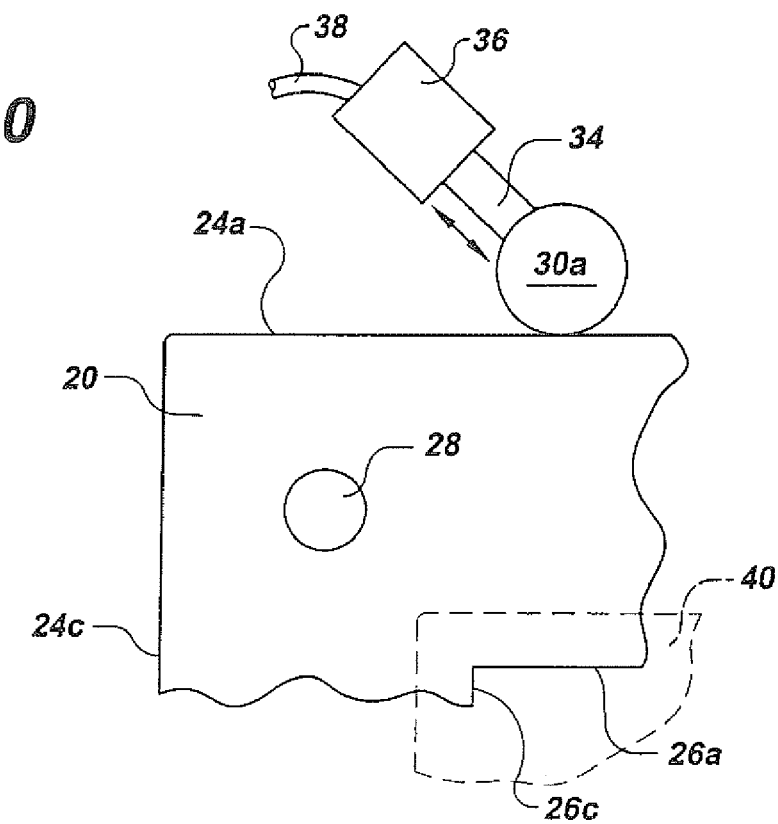
FIG. 10 is a close-up of a portion of the common frame of FIG. 1, showing another alternate embodiment of the pressure applicator.

An alternate embodiment of the pressure-applying means is depicted in FIG. 9, wherein pressure applicator pin 30a is mounted eccentrically on locator pin 31. When pin 30a is rotated in an angular direction x as shown, it acts as a cam to move a desired distance into position 30a', shown in phantom, and apply pressure to the frame edges. Another embodiment of the pressure-applying means is depicted in FIG. 10, wherein pressure applicator pin 30a is mounted on rod 34 which is extendable into and away from cylinder 36 to apply a desired force or pressure toward and away from the frame. A conduit 30a provides fluid-controlled pressure from a central source (not shown), such as an air compressor.

While the pressure-applying means may be those shown in FIGS. 6-10, other mechanical pressure-applying means may incorporate hydraulic cylinders, gears and racks, pulleys and cables, and the like. Also, instead of having movable pressure application means at each pin, they may be located on one of each opposite pairs of sides only so that, for example, in FIG. 1 pins 30b, 30c, 30d and 30e are fixed, and pins 30f, 30g, 30h and 30a are movable to apply the force.

Figure 11:
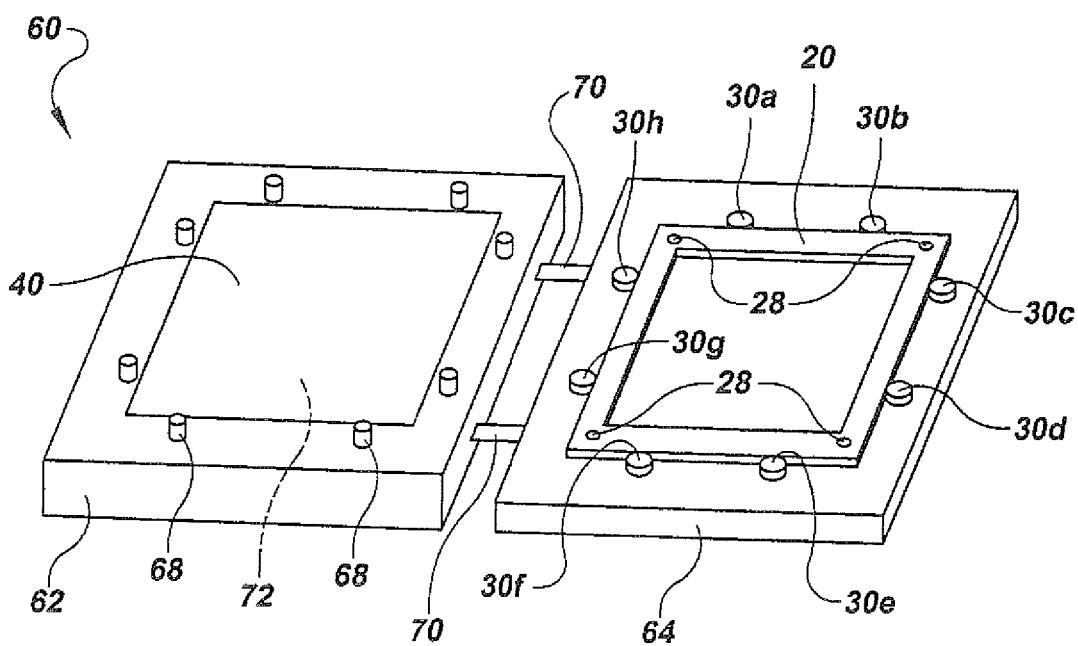
FIG. 11 is a perspective view of a frame compression fixture that operates in accordance with the present invention.
Figure 12:
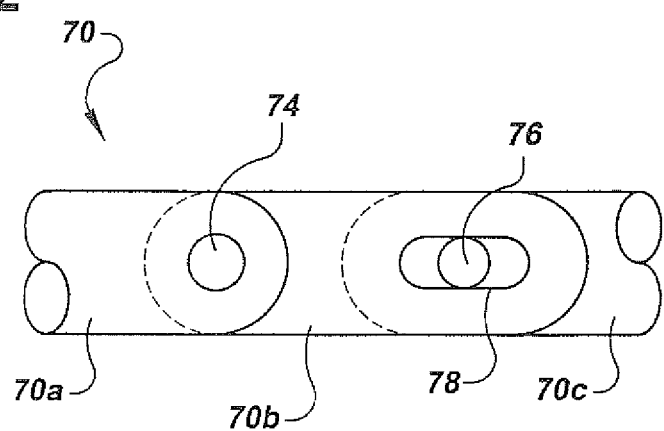
FIG. 12 is a side view of a hinge that may be used in the frame compression fixture shown in FIG. 11.

An example of a frame compression and film application fixture 60 is shown in FIG. 11. Mask film 40 is positioned within locator pins 68 on vacuum base 62 and held in place by a vacuum drawn through an underlying porous vacuum chuck 72. After a film is laid over base 62, a vacuum may be drawn to flatten the film and reduce or substantially eliminate folds and wrinkling of the film. Frame 20 is easy to load into the frame mounting base 64 and is held in place by actuation of pins 30a-h. Frame 20 and mask 40 are aligned on their respective bases so that when frame base 64 is folded on hinges 70 over vacuum base 62, the frame and film are accurately positioned relative to one another. A preferred hinge 70 is shown in FIG. 12, where hinge segment 70a, connecting to base 62, is swiveled on pin 74 to hinge segment 70b. Hinge segment 70b includes slot 78 that permits pin 76 to slide, so that when hinge segment 70c (connected to base 64) is swiveled, the hinge may accommodate different frame heights between bases 62 and 64. The adhesive may be applied initially to either the frame or the film, either before or after the pressure is applied to the frame. After the film is sufficiently flattened by vacuum chuck 72 and the adhesive is applied, the frame is pre-compressed as described above and positioned over the film, and frame base 64 is pressed down by means not shown, so that the adhesive secures the film to the portions of the frame surface adjacent the inner edges, to cover the frame opening.

Once the pre-compression is released and the frame and laminated film are removed from the fixture, the film may be used within the frame in subsequent processing to complete the screening mask, and to screen the substrate. Alternatively, the film may be removed from frame, e.g., by laser cutting, and placed in another frame to screen the substrate.

The use of the preferred embodiment wherein eight contact points are employed (FIG. 1) has resulted in significant yield improvement in production of metal screening masks. The present invention thus provides a method and system that protects the mask film and maintain flatness thereof during fabrication of the mask as well as during fabrication of electronic devices, particularly MLCs.

While the present invention has been particularly described, in conjunction with a specific preferred embodiment, it is evident that many alternatives, modifications and variations will be apparent to those skilled in the art in light of the foregoing description. It is therefore contemplated that the appended claims will embrace any such alternatives, modifications and variations as falling within the true scope and spirit of the present invention.

Thus, having described the invention, what is claimed is:

1. Apparatus for mounting a film, used to fabricate a mask for use in screening an electronic device, to a common carrier frame, the frame having an outer edge and a plurality of sides and corners along an outer periphery and an opening in a central portion of the frame, comprising:
    a base for holding the frame; and
    a movable pressure applicator adapted to apply external pressure to at least two discrete positions at an acute angle to and on each of opposite sides between corners of the frame, while the frame is held in the base, to compress the frame inward and reduce the opening while the film is secured to the frame to cover the frame opening, the pressure applicator being releasable once the film is secured to the frame.

2. The apparatus of claim 1 wherein the pressure applicator is adapted to apply external pressure to the frame outer edge.

3. The apparatus of claim 1 further including means for flattening the film while it is secured to the frame to cover the frame opening.

4. The apparatus of claim 1 wherein the pressure applicator applies pressure to a plurality of discrete positions along the frame outer edge.

5. The apparatus of claim 1 wherein the pressure applicator applies pressure to at least two discrete positions on each side of the frame.

6. The apparatus of claim 1 wherein the frame has four sides, with the outer edge being along the sides, and wherein the pressure applicator applies pressure to all four sides of the frame outer edge.

7. The apparatus of claim 1 wherein the pressure applicator displaces the frame a desired distance.

8. The apparatus of claim 1 wherein the pressure applicator applies a desired force to the frame.

9. The apparatus of claim 1 wherein the pressure applicator includes pins for applying pressure directly or indirectly to the frame outer edge.

10. The apparatus of claim 9 wherein the pressure applicator includes at least one pressure cylinder for applying pressure to at least one pin.

11. The apparatus of claim 9 wherein the pressure applicator includes a cam for applying pressure to at least one pin.

12. Apparatus for mounting a film, used to fabricate a mask for use in screening an electronic device comprising:
    a common carrier frame, the frame having a plurality of sides and corners along an outer periphery, an opening in a central portion of the frame, and a notch in at least one frame segment extending from the opening in the frame central portion to permit flexing of the frame segment;
    a base for holding the frame; and
    a movable pressure applicator adapted to apply external pressure to at least two discrete positions at an acute angle to and on each of opposite sides between corners of the frame, while the frame is held in the base, to compress the frame inward and reduce the opening while the film is secured to the frame to cover the frame opening, the pressure applicator being releasable once the film is secured to the frame.

13. The apparatus of claim 1 wherein the movable pressure applicator is adapted to apply external pressure to the at least two discrete positions on opposite sides of the frame without contacting the corners of the frame.

14. The apparatus of claim 12 wherein the frame has corners and wherein the movable pressure applicator is adapted to apply external pressure to the frame without contacting the corners of the frame.

* * * * *